(12) United States Patent
Chew

(10) Patent No.: US 8,728,833 B2
(45) Date of Patent: May 20, 2014

(54) LIGHT EMITTING DEVICE USING A THERMALLY ACTIVATED COATING AND METHOD OF MANUFACTURING

(75) Inventor: Tong Fatt Chew, Penang (MY)

(73) Assignee: Intellectual Discovery Co., Ltd., Seoul (KR)

( * ) Notice: Subject to any disclaimer, the term of this patent is extended or adjusted under 35 U.S.C. 154(b) by 1140 days.

(21) Appl. No.: 11/430,494

(22) Filed: May 9, 2006

(65) Prior Publication Data

US 2007/0264739 A1    Nov. 15, 2007

(51) Int. Cl.
*H01L 21/00* (2006.01)
*H01L 27/14* (2006.01)

(52) U.S. Cl.
USPC ............... 438/26; 438/27; 257/414; 257/431

(58) Field of Classification Search
USPC ............................... 438/25–27; 257/414, 431
See application file for complete search history.

(56) References Cited

U.S. PATENT DOCUMENTS

| | | | |
|---|---|---|---|
| 5,505,985 A * | 4/1996 | Nakamura et al. | 427/66 |
| 6,518,600 B1 * | 2/2003 | Shaddock | 257/98 |
| 6,921,929 B2 * | 7/2005 | LeBoeuf et al. | 257/100 |
| 7,227,190 B2 * | 6/2007 | Yasukawa et al. | 257/79 |
| 2003/0056392 A1 * | 3/2003 | Boroson et al. | 34/335 |
| 2003/0178632 A1 * | 9/2003 | Hohn et al. | 257/99 |

* cited by examiner

*Primary Examiner* — Hsien Ming Lee
(74) *Attorney, Agent, or Firm* — Fox Rothschild, LLP

(57) ABSTRACT

An improved method for encapsulating LEDs in a polymer coat is described. A substrate houses an LED, and a polymer layer is brought into proximity with the substrate and LED. The polymer layer is melted over the substrate, encapsulating the LED onto the substrate.

3 Claims, 3 Drawing Sheets

LIGHT EMITTING DEVICE USING A THERMALLY ACTIVATED COATING AND METHOD OF MANUFACTURING

TECHNICAL FIELD

The present invention relates to an improved light emitting device and method of making the same. More specifically, the present invention relates to a light emitting device having a thermally activated polymeric composite coat and method of making the same.

BACKGROUND OF THE INVENTION

Light emitting diodes (LED) are frequently encapsulated within an epoxy based polymer. The polymer generally completely encapsulates the LED chip and bond wire. The polymer typically contains ultraviolet (UV) light inhibitors and thermally conductive fillers to reduce degradation of transmissivity caused by heat and light damage to the polymer. Heat also leads to delamination of the polymer, which causes the LED to function less effectively or not at all.

Traditional encapsulation methods such as injection molding require stringent design parameters such as temperature, viscosity, and volume to ensure proper flow characteristics of the polymer. The stringent design parameters restrict polymer components and additives that may be used. Hence, certain components and additives that may otherwise be beneficial to the longevity or efficiency of the light emitting device cannot be used because they would result in a polymer outside of the stringent design parameters. Alternatively, if certain additives or components are used in traditional methods, they may slow or complicate the encapsulation process.

BRIEF SUMMARY OF THE INVENTION

In an embodiment of the present invention a light emitting device and a method of manufacturing the same is described. The method includes providing a substrate having one or more LEDs attached to it. A polymer material is placed over the substrate and LED and the polymer material is melted to encapsulate the LED. In some embodiments, the polymer material flows by gravity, allowing freedom to include many components and additives to enhance the strength, endurance, and efficiency of the polymer material and thus the light emitting device as a whole.

In another embodiment a light emitting device is described. The light emitting device includes an LED attached to a substrate. The device further comprises an encapsulant that is deposited on the substrate and LED by melting a thermally activated polymer layer over the substrate and LED.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Polymers for use in light emitting devices often comprise numerous components and additives. Components and additives may affect the strength and durability of the polymer, its flow characteristics, and its efficiency and performance in transmitting light. Traditional methods for polymer encapsulation using involved mechanical means to direct flow, such as injection molding, require stringent design parameters such as temperature, viscosity, and volume to ensure proper flow characteristics of the polymer. For instance, injection molding polymers must have very specific viscosity and flow characteristics, and must be heated to precise temperatures to guarantee proper polymer application. The stringent design parameters restrict polymer components and additives that may be used. Polymer components and additives include, but are not limited to, polymers providing strength, durability, or enhanced performance, fillers protecting against light degradation, fillers protecting against heat degradation, and fillers enhancing or controlling light output. Hence, certain components and additives that may otherwise be beneficial to the strength, durability, longevity, performance, and/or efficiency of the light emitting device cannot be used because they would result in a polymer outside of the stringent design parameters. Alternatively, there exists little freedom to include certain additives or components in traditional encapsulation methods, because they may slow or complicate the encapsulation process.

Freedom to include additives or components in the encapsulating polymer create numerous advantages, including, but not limited to, better light extraction, better light transmissivity, and improved polymer strength and durability. In the present invention, there is great freedom to have a variety of polymer components and additives because the design parameters are less stringent for a preformed gravity flowing polymer.

Figure 1:
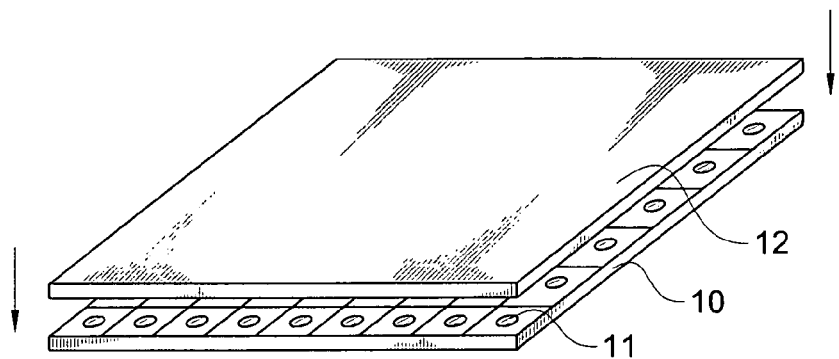
FIG. 1 is a is a perspective view of an embodiment of a substrate used in the manufacturing of light emitting devices in accordance with the present invention.
Figure 3:
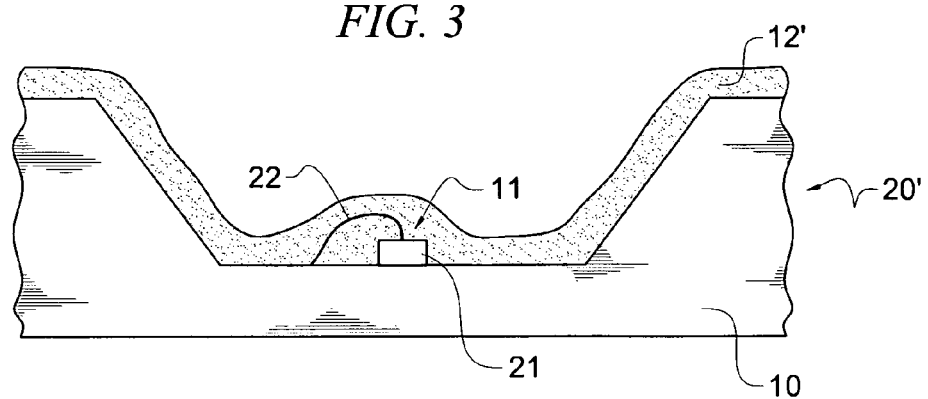
FIG. 3 is a side view of an alternate embodiment of a light emitting device in accordance with the present invention.

Referring now to FIG. 1, an embodiment of a substrate used to make light emitting devices in accordance with the present invention is shown. Substrate 10 houses one or more light emitting diodes (LEDs) 11. Polymer 12 is positioned above substrate 10. Polymer 12 is melted such that polymer 12 encapsulates LED 11 onto substrate 10. The design parameters are less stringent because polymer 12 is generally preformed and flows by gravity. Referring now to FIGS. 1 and 3, in some embodiments, melted polymer 12' is allowed to cool and harden. In some embodiments, substrate 10 is divided to separate individual or groups of encapsulated light emitting devices. Substrate 10 may be divided by any suitable means, such as, but not limited to, cutting, shearing, pressure breaking, thermal cutting, and sawing.

Embodiments of substrate 10 may include any material suitable for having at least one LED attached to it, such as, but not limited to, a conventional printed circuit board, a reflector for reflecting emitted light, a metal, mineral, or plastic frame for holding cathodes, anodes, or other pieces in place either temporarily or permanently, or any combination of these or other commercially available materials. In yet other embodiments, substrate 10 comprises a permanent part of the finished product; in other embodiments, substrate 10 is used only temporarily during the manufacturing process. In some embodiments, substrate 10 comprises etchings or other minor irregularities to improve bond with polymer 12. Such enhanced sealing or bonding further promotes the integrity and reliability of the light emitting device 20. Substrate 10 may be of any suitable shape and thickness. It may house one or more LEDs 11.

Figure 2:
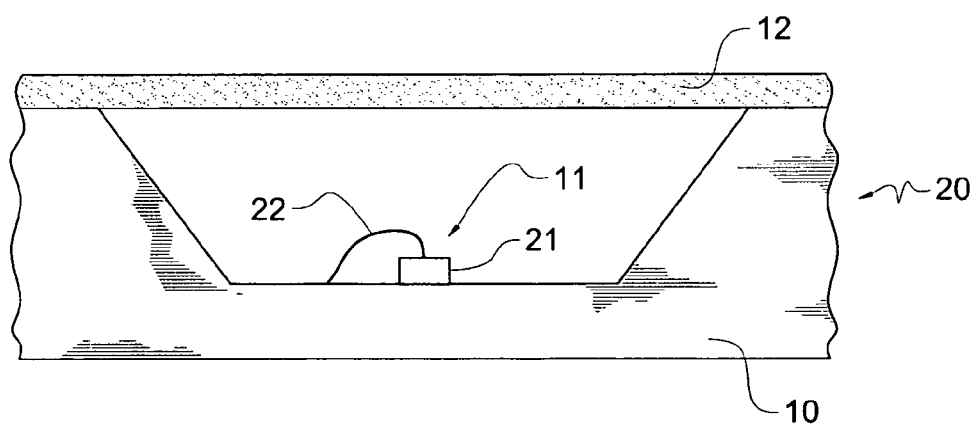
FIG. 2 is a side view of an embodiment of a light emitting device in accordance with the present invention.

Referring to FIGS. 1, 2, and 3, LED 11 may be any conventional light emitting diode 21. Referring to FIG. 2, in some embodiments the light emitting device comprises conventional LED 21 and conventional wire bond 22. LED device can be of any type, including, but not limited to, a chip LED, an PLCC, or a lamp. LED 11 may be attached to substrate 10 in any conventional manner, such as, but not limited to, die bonded, adhesive bonded, soldered, gravity rested, tied, permanently attached, removably attached, or any combination of conventional attachment methods.

Polymer 12 may be any commercially available polymer composite. As used herein, polymer composite refers to any one polymer, a combination of polymers, or a combination of polymers and other substances. In a preferred embodiment, polymer 12 comprises an epoxy based polymer, such as any of various thermally activated polymeric composite materials capable of forming tight cross-linked polymer structures characterized by toughness, strong adhesion, and low shrinkage. Other commercially available thermally activated compliant and translucent materials may be used as long as the light emitting source is encapsulated. As used herein, thermally activated means thermosetting or thermoplastic polymers that are solids at normal operating temperatures, but may be heated and melted one or more times and then cooled to produce a tough solid adhesive.

Solid polymer 12 is positioned over substrate 10 that houses LED 11. Polymer 12 may be prefabricated to match the size of substrate 10. Referring to FIG. 1, an embodiment of polymer 12 is in the shape of a rectangular thin sheet matching the length and width of substrate 10. In the embodiment of FIG. 1, substrate 10 houses nine columns and six rows of LEDs, for a total of fifty-four LEDs though an array involving any number of devices may be used. Polymer 12 is positioned over substrate 10 to cover all LEDs 11. As used herein, positioning over means bringing polymer 12 into a complimentary alignment with substrate 10 and bringing polymer 12 into the proximity of substrate 10 and LED 11. In some embodiments, polymer 12 rests upon substrate 10 (or other elevated components, such as LED 11) by gravity. In other embodiments, conventional mechanical machinery, such as mechanical arms, bring polymer 12 in close proximity with substrate 10.

Polymer 12 may be any suitable shape and thickness. In some embodiments, polymer 12 is of the same shape and length and width dimensions as the substrate to which it corresponds. Polymer 12 and substrate 10 may be any shapes, including, but not limited to, rectangular, circular, polygonal, and curviliniear. In some embodiments, polymer 12 layer has a uniform thickness; in other embodiments, polymer 12 layer has a varying thickness. In one embodiment, polymer 12 comprises regions of relative thickness corresponding to the area above LED 11 on substrate 10. In some embodiments, polymer 12 is of a thickness just sufficient to permit the melted polymer to coat LED 11 to substrate 10. Having a thin layer of polymer 12 reduces the internal stresses placed upon encapsulated LED 11.

Once in proper position relative to substrate 10 and LED 11, polymer 12 is melted. As polymer 12 is melted, it flows over and encapsulates the LED 11 to substrate 10. In some embodiments, melted polymer 12 flows by gravity. The temperature to which polymer 12 may be heated is any temperature suitable for allowing the polymer sheet to melt and encapsulate LED 11 onto substrate 10. The appropriate melting temperature depends on several factors, including, but not limited to, the composition of the polymer composite and the thickness of the polymer layer. In some embodiments, polymer 12 has a melting temperature of at least 260 degrees Celsius in order to withstand future high temperatures, such as, but not limited to, those temperatures corresponding to the solder reflow temperature when the LEDs are soldered to printed circuit boards.

Flow of polymer 12 by gravity or other limited mechanical means provides several advantages as described above. In some embodiments, beneficial polymer components and additives in polymer 12 cause increased light extraction and transmission efficiency of device 20'. Because of total internal reflection, only a fraction of the light that is generated within LED 11 can escape into polymer 12. According to Snell's law, light can travel from a medium of higher refractive index into a medium of lower refractive index only if it intersects the interface between the two media at an angle less than the critical angle for the two media. Generally, the closer the refractive indexes of the two mediums, the greater the critical angle and therefore the more light that is transmitted. The wide variety of compositions and design parameters for polymer 12 allows for a greater control over the refractive index of polymer 12 as compared to the prior art. Hence, in some embodiments, polymer 12 comprises a refractive index at or near the refractive index of LED 11. Although the refractive index of polymer 12 may very greatly from one embodiment to another, in some embodiments, the refractive index of polymer 12 is above 1.5. In other embodiments, the refractive index of polymer 12 is above 1.6.

Figure 4:
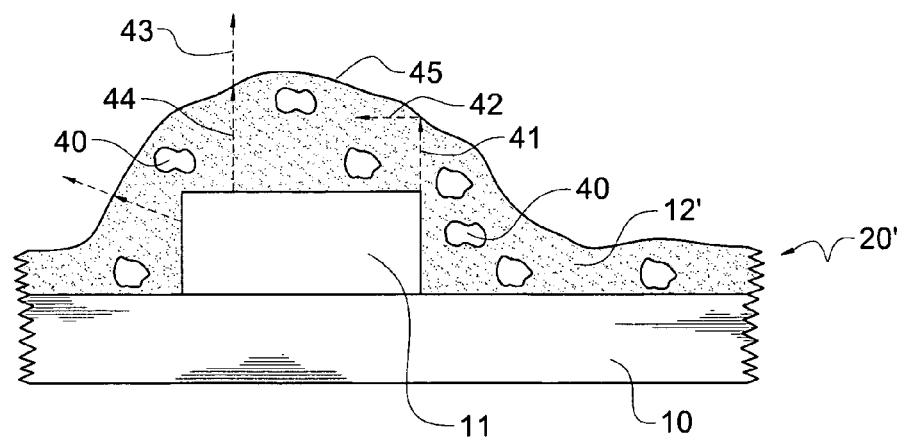
FIG. 4 is a detailed side view of an embodiment of a light emitting device in accordance with the present invention.

Additionally, in some embodiments, polymer 12 is of a thickness just sufficient to permit the melted polymer to coat LED 11 to substrate 10. In other embodiments, polymer 12 is of a thickness sufficient to permit extra encapsulating material to cover LED 11 and substrate 10. In one embodiment, as shown in FIG. 4, polymer 12' encapsulates LED 11 and generally conforms to the shape of LED 11. The conformed shape of polymer 12' increases light extraction and transmission efficiency of device 20' because, in general, light will pass through polymer 12' with least reflection loss if the light meets the polymer/air interface at approximately a right angle. For example, referring to FIG. 4, LED 11 emits light ray 41, which strikes polymer/air interface 45 at something other than a right angle. Thus, light ray 41 is reflected and becomes reflected light ray 42 and is not emitted to the air. On the other hand, LED 11 emits light ray 44, which strikes polymer/air interface 45 at a right angle, and thus light ray 44 becomes emitted light ray 43. The conformed shape of polymer 12' results in a large surface area at which the polymer/air interface will be perpendicular to light emitted from LED 11, and thus increases transmission efficiency by decreasing reflection loss.

Referring to FIG. 4, in some embodiments, fillers 40 are added to polymer 12. In some embodiments, fillers 40 protect polymer 12 from degradation. Many ambient factors can degrade polymer 12, such as, but not limited to, light, pressure, chemicals, dirt, and temperature. Some degrading factors, especially temperature, can originate from LED 11 itself. Degradation can take many forms, including, but not limited to, causing polymer 12 to break down chemically, become brittle, pull away from substrate 10, place internal stress on encapsulated components, or become less transparent or translucent to light from LED 11. Fillers 40 may be added in numerous ways, such as, but not limited to, being added to polymer 12 prior to the step of melting. In some embodiments, separate fillers put into contact with polymer 12 and are mixed into the polymer upon melting.

Light, especially UV light from any source, can degrade polymers over time, causing them to break down or become less transparent or translucent to light. In some embodiments, fillers 40 comprise UV retardants to protect against light degradation of the encapsulating polymer. Additionally, changes in temperature of polymers can cause them to degrade over time. Furthermore, when polymer 12' has a different coefficient of thermal expansion than substrate 10, changes in temperature cause substrate 10 and polymer 12' to expand or contract at different rates, and can lead to separation of polymer 12' from substrate 10. In come embodiments, fillers 40 comprise thermal conductors to dissipate heat from light emitting device 20 and protect against thermal degradation. In some embodiments, fillers 40 comprise silica particles, which has UV retardant and thermally conductive properties.

Light emitting device 20 may produce any color of light. In one embodiment, light emitting device 20 produces white light. White light may be produced by any conventional manner, and in some embodiments, polymer 12' comprises fillers 40 comprising phosphors to promote white light production. In one embodiment, LED 11 comprises a blue-light-emitting semiconductor surrounded by polymer 12' comprising fillers 40 comprising yellow phosphor. The fillers 40 in polymer 12' mixture coats LED 11, and a portion of the blue emission from LED 11 is absorbed by filler 40 and reemitted at the longer phosphorescence wavelength. Complementary blue and yellow wavelengths combine through additive mixing to produce the desired white light.

In another embodiment, light emitting device 20' produces white light utilizing fillers 40 comprising broad-spectrum phosphors that are optically excited by ultraviolet radiation. In another embodiment, fillers 40 comprise dyes incorporated into polymer 12'. Fillers 40 convert emitted wavelengths for white diode applications. The dyes may be any commercially available dyes, such as, but not limited to organic compounds. The light generated by LED 11 must match the absorption profile of the converting dye, which in turn emits light at the desired longer wavelength.

Figure 5:
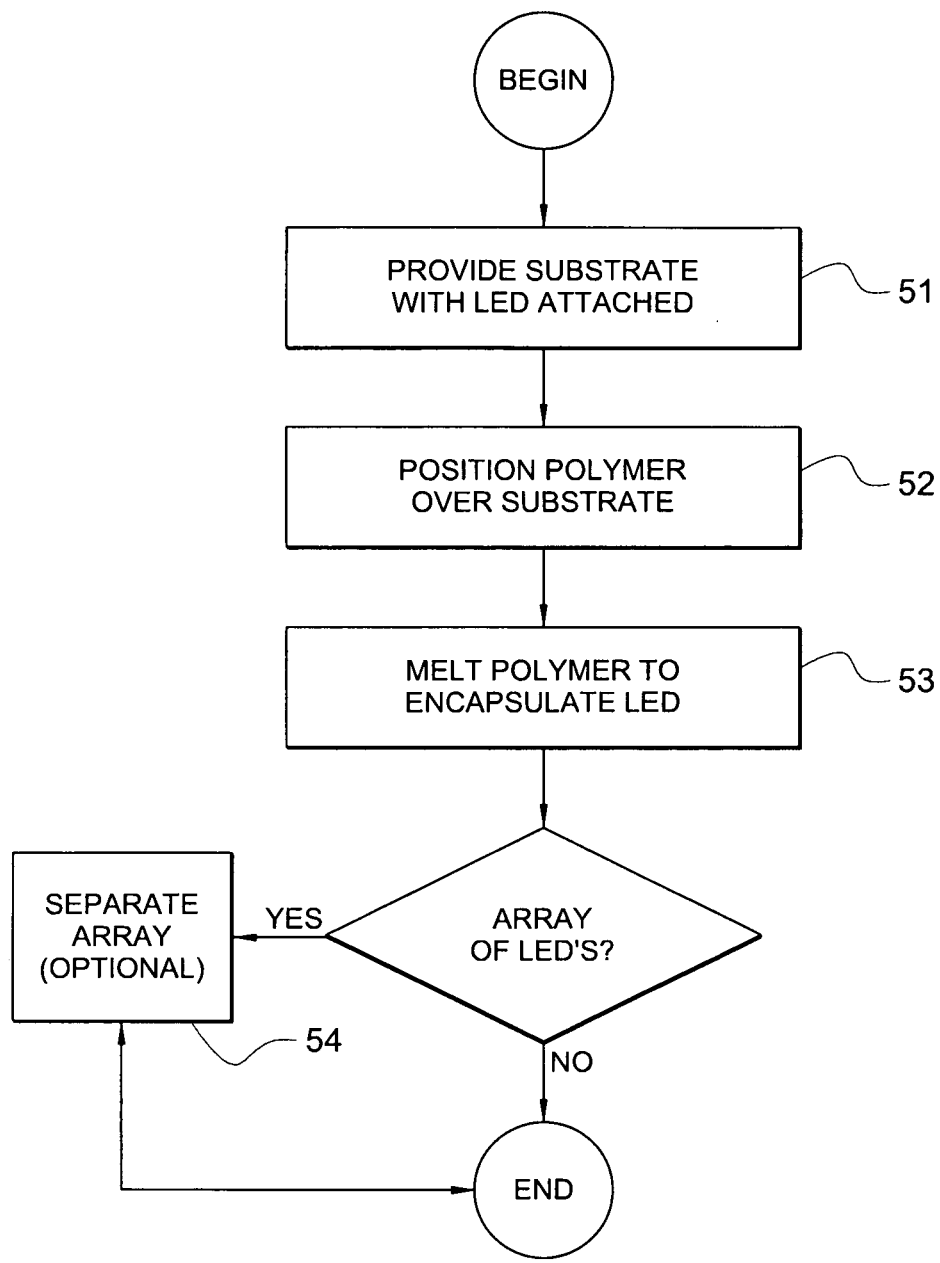
FIG. 5 is a flow chart showing an embodiment of a method of making a light emitting device in accordance with the present invention.

Referring now to FIG. 5, a flow chart is provided demonstrating some embodiments of the present invention. Process 51 shows providing a substrate with one or more LEDs attached to the substrate. In some embodiments, an array of LEDs is provided attached to a substrate. Process 52 demonstrates positioning the polymer over the substrate, such as by bringing the polymer into a complimentary alignment with the substrate and bringing the polymer into the proximity of the substrate and LED. As described previously, the polymer may be prefabricated to match the size of the substrate. Process 53 shows the step of melting the polymer to encapsulate the LED. In some embodiments, the device comprises a single LED, in which case the decision "array of LEDs?" indicates "no," and the process ends. In some embodiments, an array of LEDs is provided, in which case the decision "array of LEDs?" indicates "yes," and an optional Process 54 may be engaged. Process 54 comprises separating the cooled and hardened array into separate pieces. In some embodiments, an array is separated into individual LEDs. In other embodiments, the array is separated into pieces containing multiple LEDs. In still other embodiments, the array is not separated into pieces.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a plurality of light emitting devices, comprising:
   providing a substrate having a plurality of LEDs attached thereon;
   positioning a solid thermally activated polymer layer over the substrate and the plurality of LEDs;
   melting the thermally activated polymer layer such that the thermally activated polymer layer encapsulates the LEDs; and
   separating the plurality of encapsulated LEDs into segments of one or more LEDs.

2. The method of claim 1 wherein said positioning comprises resting the thermally activated polymer layer on the substrate.

3. The method of claim 1 wherein melting the thermally activated polymer layer further comprises allowing to flow by gravity.

* * * * *